United States Patent
Shuto

(10) Patent No.: US 10,962,568 B2
(45) Date of Patent: Mar. 30, 2021

(54) JIG

(71) Applicant: Kabushiki Kaisha Nihon Micronics, Tokyo (JP)

(72) Inventor: Akihiro Shuto, Oita (JP)

(73) Assignee: Kabushiki Kaisha Nihon Micronics, Tokyo (JP)

( * ) Notice: Subject to any disclaimer, the term of this patent is extended or adjusted under 35 U.S.C. 154(b) by 83 days.

(21) Appl. No.: 16/483,869

(22) PCT Filed: Feb. 6, 2018

(86) PCT No.: PCT/JP2018/003892
§ 371 (c)(1),
(2) Date: Aug. 6, 2019

(87) PCT Pub. No.: WO2018/147246
PCT Pub. Date: Aug. 16, 2018

(65) Prior Publication Data
US 2020/0025800 A1    Jan. 23, 2020

(30) Foreign Application Priority Data
Feb. 7, 2017 (JP) .............................. JP2017-020260

(51) Int. Cl.
*G01R 1/07* (2006.01)
*G01R 1/073* (2006.01)
*G01R 1/067* (2006.01)
*G01R 1/16* (2006.01)
*G01R 31/28* (2006.01)

(52) U.S. Cl.
CPC ......... *G01R 1/073* (2013.01); *G01R 1/06722* (2013.01); *G01R 1/16* (2013.01); *G01R 31/2808* (2013.01); *G01R 31/2863* (2013.01)

(58) Field of Classification Search
CPC ... G01R 1/06722; G01R 1/16; G01R 31/2808
See application file for complete search history.

(56) References Cited

U.S. PATENT DOCUMENTS 5,677,635 A    10/1997 Fujii et al.
9,583,857 B2    2/2017 Nasu et al.
(Continued)

FOREIGN PATENT DOCUMENTS

EP    3015868 A1    5/2016
JP    H07146316 A    6/1995
(Continued)

*Primary Examiner* — Alvaro E Fortich
(74) *Attorney, Agent, or Firm* — Lorenz & Kopf, LLP

(57) ABSTRACT

Provided is a jig enabling detachment and attachment of a probe head from and to an electric connecting apparatus without using a special holding device. A jig (50) is applied to an electric connecting apparatus (10) electrically connecting a device under test to a testing apparatus for the device under test. The electric connecting apparatus includes a wiring substrate (22) and a probe head (28) secured to the wiring substrate with a plurality of set screws (26) and including a plurality of probes (34) made of a magnetic body. The jig (50) includes a plate (52) and a magnet (54) attached to the plate. The plate can detachably be attached to the probe head, and the magnet is opposed to a lower end portion (34 *b*) of each of the probes.

6 Claims, 6 Drawing Sheets

(56) References Cited

U.S. PATENT DOCUMENTS

| | | | |
|---|---|---|---|
| 2015/0253358 A1 | 9/2015 | Chen et al. | |
| 2016/0025479 A1* | 1/2016 | Vuilloud | G01D 15/28 73/866.5 |
| 2016/0187376 A1* | 6/2016 | Humphris | G01Q 70/02 850/18 |
| 2017/0045554 A1 | 2/2017 | Liao et al. | |
| 2018/0106855 A1* | 4/2018 | Zhang | G01R 1/07364 |

FOREIGN PATENT DOCUMENTS

| | | | |
|---|---|---|---|
| JP | 2005308611 A | 11/2005 |
| JP | 2012225845 A | 11/2012 |
| JP | 2016080657 A | 5/2016 |
| KR | 100774914 B1 | 11/2007 |
| KR | 101513525 B1 | 4/2015 |
| WO | WO2011115082 A1 | 9/2011 |

\* cited by examiner

JIG

TECHNICAL FIELD

The present invention relates to a jig to be applied to an electric connecting apparatus.

BACKGROUND ART

An electric connecting apparatus to which the present invention is applied includes a wiring substrate and a probe head attached to the wiring substrate. A probe head used for a vertical probe card includes a plurality of probes each including upper and lower end portions and an intermediate portion between the upper and lower end portions and made of a magnetic body and a support body supporting the probes. The support body includes an upper plate and a lower plate which are parallel to each other, the upper plate includes holes allowing the lower end portions, the intermediate portions, and the upper end portions of the respective probes to pass therethrough, and the lower plate includes holes allowing the lower end portions of the respective probes to pass therethrough and preventing the intermediate portions of the respective probes from passing therethrough.

Meanwhile, each probe of the probe head is subject to abrasion, bending, breakage, a conduction failure, and the like due to usage thereof, and the probe head is detached from the electric connecting apparatus for replacement of the probe. In the probe head detached from the electric connecting apparatus, each probe is in a state of enabling movement in an axial direction thereof and enabling the lower end portion thereof to stick out of the hole of the lower plate of the support body along with the movement. For this reason, detachment of the probe head and attachment (reattachment) thereof after probe replacement are performed in a state in which the vertical direction of the probe head is kept to prevent the probe head from being turned upside down. However, since some electric connecting apparatuses weigh over 10 kg, for example, detachment and reattachment of the probe head are required to be performed in a state in which the electric connecting apparatus is held by a special holding device.

CITATION LIST

Patent Literature

PTL1: Japanese National Patent Application Public Disclosure No. 2016-80657

SUMMARY OF THE INVENTION

Problems to be Solved by the Invention

The present invention provides a jig enabling detachment and reattachment of a probe head from and to an electric connecting apparatus without using a special holding device.

Solutions to the Problems

The present invention relates to a jig applied to an electric connecting apparatus electrically connecting a device under test to a testing apparatus for the device under test. The electric connecting apparatus to which the present invention is applied includes a wiring substrate and a probe head secured to a surface of the wiring substrate opposed to the device under test with a plurality of set screws. The probe head includes a plurality of probes each including upper and lower end portions and an intermediate portion between the upper and lower end portions and made of a magnetic body and a support body supporting the plurality of probes. The support body includes an upper plate and a lower plate which are parallel to each other, the upper plate includes a hole allowing the lower end portion, the intermediate portion, and the upper end portion of each of the probes to sequentially pass therethrough, and the lower plate includes a hole allowing the lower end portion of each of the probes to pass therethrough and preventing the intermediate portion of each of the probes from passing therethrough. The jig according to the present invention includes a plate and a magnet attached to the plate. The plate includes a plurality of holes corresponding to a plurality of screw holes provided in the support body and can detachably be attached to the probe head via a plurality of screws screwed through the plurality of holes into the screw holes, and the magnet is opposed to the lower end portion of each of the probes.

In replacement work of the probes of the probe head of the electric connecting apparatus performed with use of the jig according to the present invention, the electric connecting apparatus is first placed with the probe head facing upward, and the probe head is detached from the wiring substrate. More specifically, the plurality of set screws are loosened and removed to release securement of the probe head to the wiring substrate. Thereafter, the jig is arranged on the probe head and is attached to the probe head. The jig can be attached by screwing the plurality of screws through the plurality of holes of the plate into the plurality of screw holes provided in the support body. At this time, the magnet of the jig is opposed to the lower end portions of the plurality of probes. Consequently, the probes are subject to a magnetic attraction force of the magnet and are in states of being attracted toward the plate, that is, in states of being prevented from relative movement of the probes to the support body in an axial direction and sticking of the lower end portions of the probes out of the holes of the lower plate of the support body along with this movement. Thereafter, the jig is separated from the probe head in a state in which the vertical direction of the probe head is kept, and replacement work of the probes can be performed. Also, the probe head after replacement of the probes can be attached to the wiring substrate again in a reverse procedure of the aforementioned detaching procedure. This can dispense with detachment and attachment of the probe head with use of a holding device for the electric connecting apparatus.

The plate can include a plurality of holes respectively corresponding to the plurality of set screws. Accordingly, after the jig is attached to the probe head, the tip end portion of a screwdriver can be inserted into each of the holes of the plate corresponding to the set screws to loosen and pull out each of the set screws via the holes corresponding to the set screws, and securement of the probe head to the wiring substrate can thus be released. The magnet may be a permanent magnet or an electromagnet. The probe includes a barrel including a spring portion that can expand and contract in an axial direction thereof and a plunger including a main body arranged in the barrel and secured to the barrel and a tip end portion protruded out of the barrel, for example. The barrel defines the upper end portion and the intermediate portion of each of the probes, and the tip end portion of the plunger defines the lower end portion of each of the probes.

EMBODIMENTS OF THE INVENTION

Figure 1:
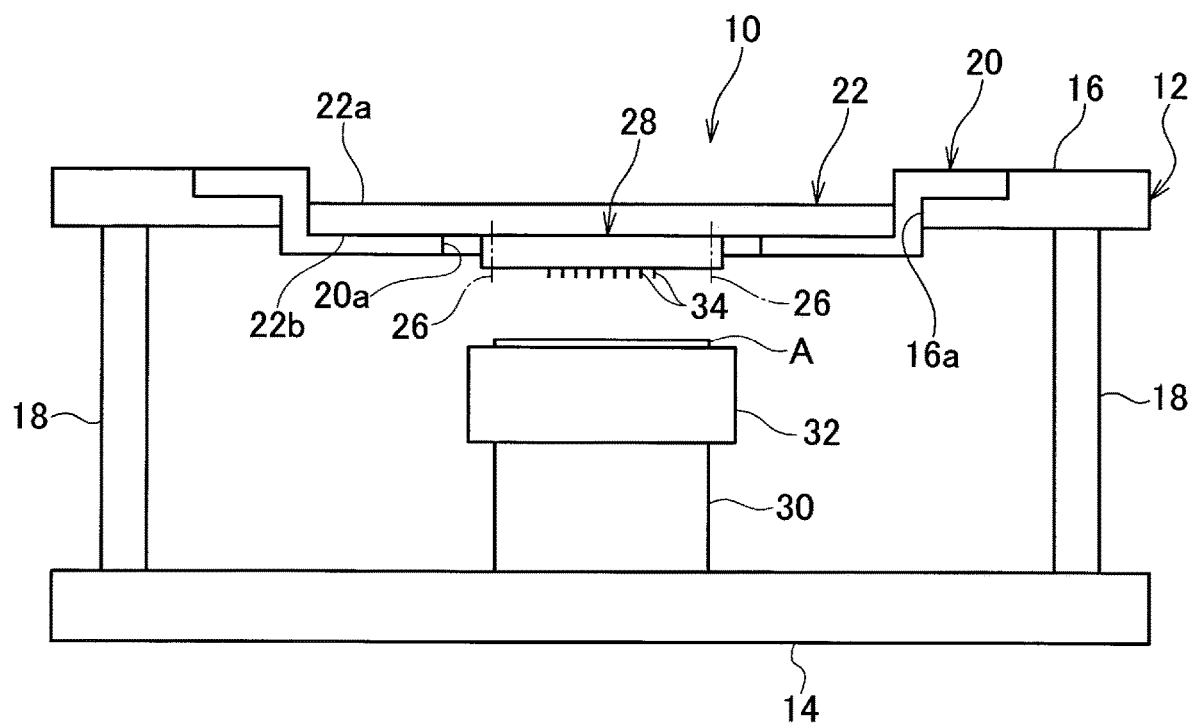
FIG. 1 is a schematic view illustrating a device under test and an electric connecting apparatus.

Referring to FIG. 1, an electric connecting apparatus to which a jig 50 (refer to FIG. 4 described below) according to the present invention is applied is entirely illustrated with reference sign 10. The electric connecting apparatus 10 functions to electrically connect a device under test A such as a wafer, a printed wiring board etc. to a testing apparatus (not illustrated) performing a test to check an electric characteristic, a conductive state etc. of the device under test A, for example. The test of the device under test A is performed by supplying electric current or an electric signal from the testing apparatus via the electric connecting apparatus 10 to the device under test A and detecting feedback electric current or a feedback electric signal returning from the device under test A via the electric connecting apparatus 10 to the testing apparatus.

The device under test A is arranged in a support frame 12 prepared to support the electric connecting apparatus 10. The support frame 12 includes a lower base member 14, an upper base member 16 arranged above the lower base member to be parallel to the lower base member, and a plurality of pillars 18 supporting the upper base member 16 over the lower base member 14. The electric connecting apparatus 10 is held on the upper base member 16 via a holding member 20. The upper base member 16 includes an opening 16a provided at a center portion thereof, and the holding member 20 is partially fitted into the opening 16a of the upper base member 16. The holding member 20 also includes an opening 20a at a center portion thereof.

The electric connecting apparatus 10 includes a wiring substrate 22 including surfaces 22a and 22b opposed to each other and a so-called vertical probe head 28 secured on the surface 22b of the wiring substrate 22 or the surface 22b opposed to the device under test A with a plurality of (four in the illustrated example) set screws 26. The illustrated probe head 28 is formed in a rectangular planar shape and is received in the opening 20a of the holding member 20 holding the electric connecting apparatus 10.

The device under test A is provided directly under the probe head 28 of the electric connecting apparatus 10 and is held on a chuck 32 on a stage 30 arranged on the lower base member 14. The stage 30 functions to move the device under test A held on the chuck 32 in two directions (X and Y directions) perpendicular to each other on a plane or in an up-down direction (Z direction) or rotate the device under test A around the axis of the stage 30 for positioning the device under test A with respect to the probe head 28.

Figure 2:
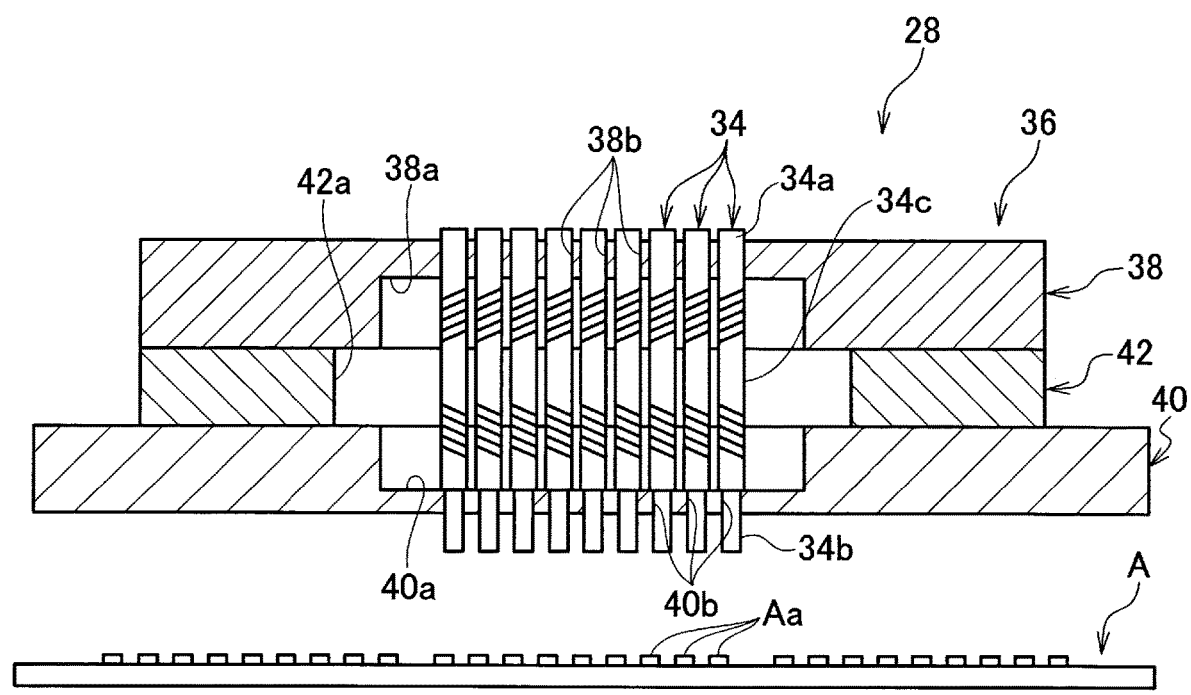
FIG. 2 is a schematic cross-sectional view of a probe head in the electric connecting apparatus.

As illustrated in FIG. 2, the probe head 28 includes a plurality of probes 34 made of a magnetic body (for example, a nickel material serving as a ferromagnetic body) and a support body 36 supporting the probes 34 vertically in the up-down direction. Each probe 34 includes an upper end portion 34a and a lower end portion 34b opposed to each other and an intermediate portion 34c provided between the upper end portion 34a and the lower end portion 34b and connected to the upper and lower end portions.

The support body 36 supporting the probes 34 includes an upper plate 38 and a lower plate 40 parallel to each other. In the illustrated example, the upper plate 38 and the lower plate 40 include recesses 38a and 40a provided at center portions thereof and opened upward and downward, respectively. The upper plate 38 and the lower plate 40 also include a plurality of holes 38b and 40b penetrating the upper plate 38 and the lower plate 40 and communicated with the recesses 38a and 40a, respectively. As for the holes 38b and 40b, each of the holes 38b has a larger diameter than each of the diameters of the upper end portion 34a, the lower end portion 34b, and the intermediate portion 34c of the probe 34, and each of the holes 40b has a diameter larger than the diameter of the lower end portion 34b of the probe 34 and smaller than each of the diameters of the upper end portion 34a and the intermediate portion 34c. In the illustrated example, a plate-like spacer 42 is further arranged between the upper plate 38 and the lower plate 40. The spacer 42 includes a hole 42a formed at a center portion thereof, penetrating the center portion, and communicated with the recesses 38a and 40a of the upper plate 38 and the lower plate 40.

Figure 4:
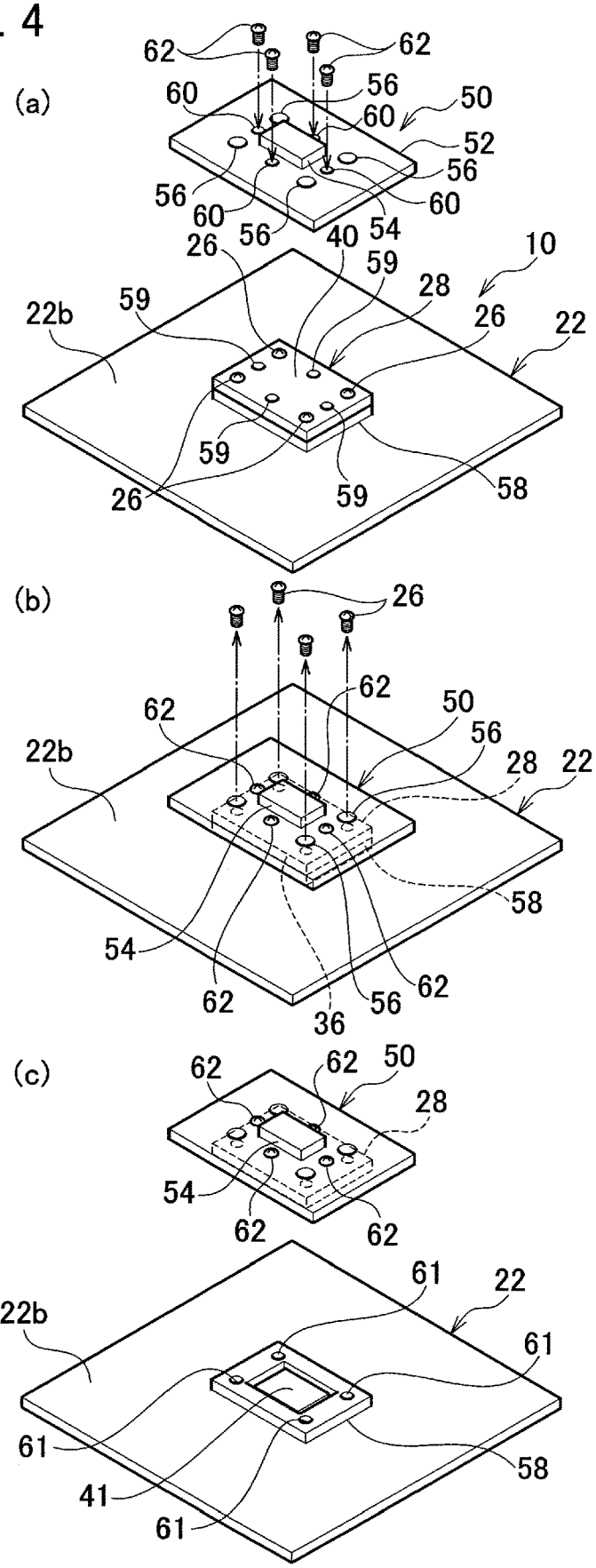
FIGS. 4(a), 4(b), and 4(c) are perspective views illustrating a jig and a procedure for detaching the probe head from the electric connecting apparatus with use of the jig.
Figure 6:
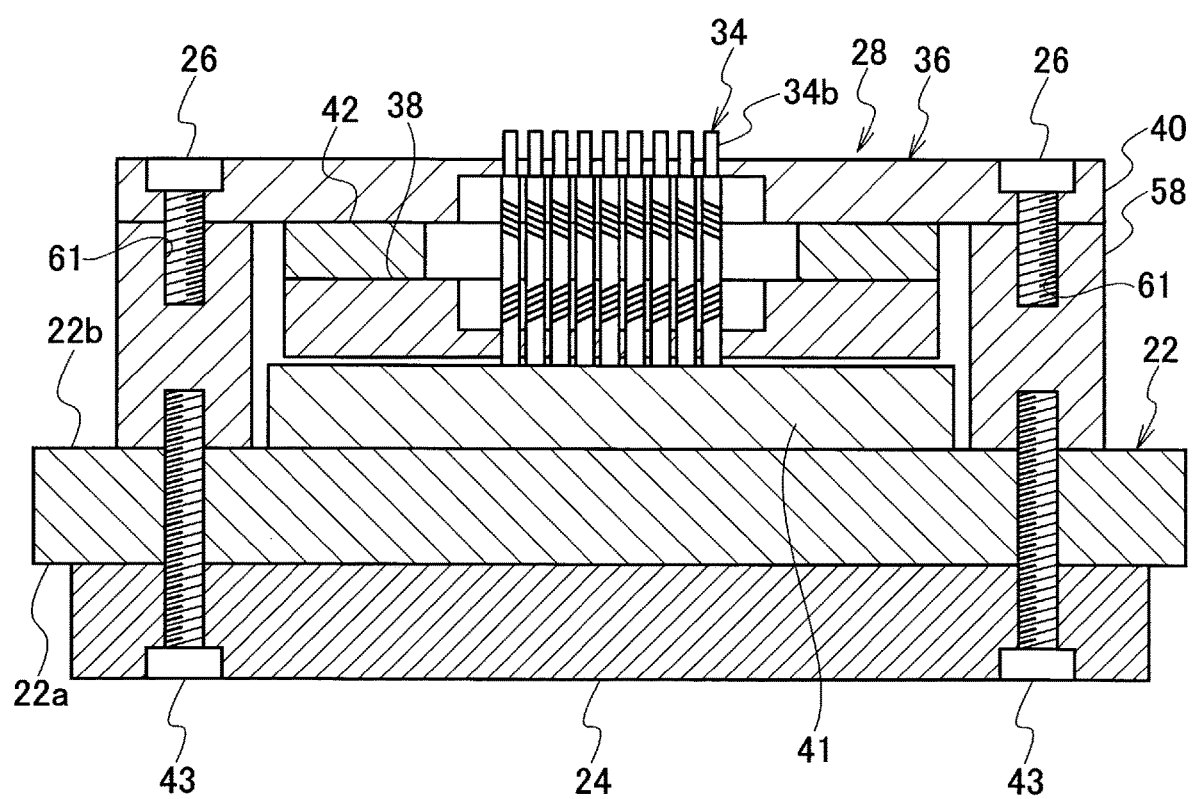
FIG. 6 is a cross-sectional view of the probe head held upside down attached to a wiring substrate via an alignment ring.

In the illustrated example, the probe head 28 is secured to the wiring substrate 22 via an alignment ring 58 (FIGS. 4 and 6). The alignment ring 58 is a member installed to align the upper end portions 34a of the probes 34 of the probe head 28 with electrodes (not illustrated) of a pitch conversion substrate 41. The alignment ring 58 entirely formed in a rectangular shape is attached to the surface 22b of the wiring substrate 22 and surrounds circumferences of the upper plate 38 and the spacer 42, which are parts of the probe head 28. More specifically, the probe head 28 is secured at the lower plate 40 thereof to the alignment ring 58 via the respective set screws 26 screwed in four screw holes 61 of the alignment ring 58 and is secured to the wiring substrate 22 via the alignment ring 58. In FIG. 6, reference sign 24 indicates a plate-like stiffener attached to the surface 22a of the wiring substrate 22 to reinforce the wiring substrate 22. The stiffener 24 is secured to the wiring substrate 22 via a plurality of bolts 43 extending through the wiring substrate 22 and screwed in the alignment ring 58. Note that installation of the alignment ring 58 may be omitted. In this case, the probe head 28 can be secured to the wiring substrate 22 with use of a set screw (not illustrated) that extends inside the stiffener 24 sequentially through the support body 36 including the lower plate 40, the spacer 42, and the upper plate 38, the pitch conversion substrate 41, and the wiring substrate 22 and that can be screwed in the stiffener, for example.

Each of the holes 38b of the upper plate 38 of the support body 36 allows the lower end portion 34b, the intermediate portion 34c, and the upper end portion 34a of each of the probes 34 to sequentially pass therethrough, and each of the holes 40b of the lower plate 40 allows the lower end portion 34b of each of the probes 34 to pass therethrough and prevents the intermediate portion 34c from passing therethrough. Also, each of the probes 34 extends through the hole 42a of the spacer 42 of the support body 36 at the intermediate portion 34c thereof. Consequently, each of the probes 34 is supported to enable relative movement to the support body 36 in the up-down direction in a state in which parts of the upper end portion 34a and the lower end portion 34b are protruded upward and downward from the upper plate 38 and the lower plate 40 of the support body 36, respectively. Meanwhile, the upper end portions 34a of the respective probes 34 are in states of abutting on respective electrodes (not illustrated) provided on the wiring substrate 22 when the probe head 28 is secured to the wiring substrate 22.

Figure 3:
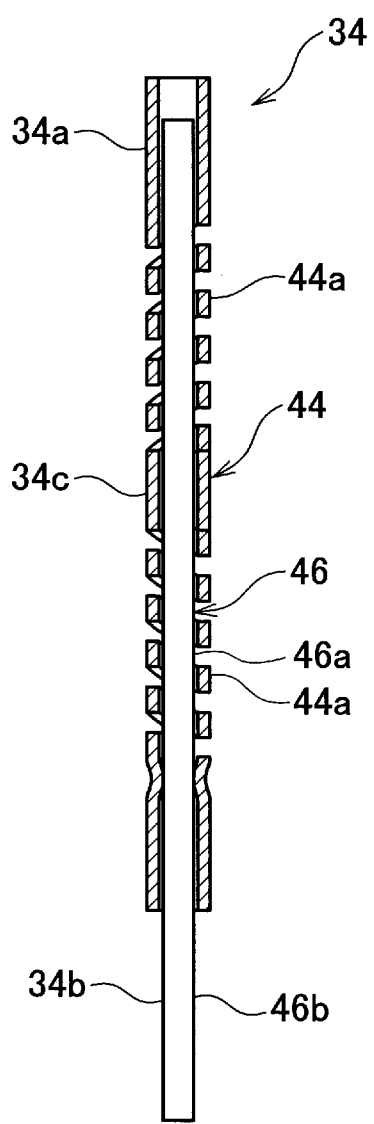
FIG. 3 is a cross-sectional view of a probe.

FIG. 3 illustrates an example of the probe 34. The probe 34 illustrated in FIG. 3 includes a barrel 44 formed in a cylindrical shape and a plunger 46 arranged in the barrel and formed in a columnar shape. The barrel 44 includes two spring portions 44a that can expand and contract in the axial direction. The number of the spring portions 44a is arbitrary. The plunger 46 includes a main body 46a secured to the barrel 44 and a tip end portion 46b protruded outward from one end of the barrel 44. The plunger 46 is secured around the aforementioned end of the barrel 44. The securement is performed by means of swaging as in the illustrated example, resistance welding, laser welding, or the like. As for the barrel 44 and the plunger 46, the barrel 44 constitutes parts (the upper end portion 34a and the intermediate portion 34c) of the probe 34, and the tip end portion 46b of the plunger 46 constitutes the lower end portion 34b of the probe.

Referring to FIG. 2 again, at the time of the test, the device under test A is moved up toward the probe head 28 located above the device under test A, and a plurality of electrode pads Aa provided on the device under test A abut on the lower end portions 34b of the plurality of corresponding probes 34, that is, the tip end portions 46b of the plungers 46. As a result, the tip end portions 46b of the plungers 46 as well as the parts of the barrels 44 secured to the tip end portions 46b move upward with respect to the lower plate 40 of the support body 36, and along with this movement, the probes 34 are compressed at the spring portions 44a, which are other parts of the barrels 44. Consequently, conductive paths are formed between the testing apparatus and the device under test A.

Next, referring to FIG. 4, the jig 50 according to the present invention is illustrated. When the plurality of probes 34 of the probe head 28 are partially or entirely subject to failures such as abrasion, bending, breakage, and conduction failures, the jig 50 is used to replace the failed probes 34 with new ones.

The jig 50 includes a plate 52 and a magnet 54 attached to the plate, and the plate 52 includes a plurality of holes 56 respectively corresponding to the plurality of set screws 26. Each of the holes 56 of the plate 52 has a larger diameter than that of the head portion of the set screw 26. The illustrated plate 52 is made of a material that does not block a magnetic force of the magnet 54, such as an acrylic resin, and has a larger rectangular planar shape than that of the probe head 28. Also, in the illustrated example, the number of the plurality of holes 56 is four, and the four holes 56 are provided at four corners of the rectangle. The magnet 54 is a permanent magnet or an electromagnet and has as strong a magnetic force as to enable all of the probes 34 to be magnetically attracted. The magnet 54 can be attached to the plate 52 by adhering to the plate 52 or being partially or entirely buried in the plate 52.

The jig 50 can be attached to the probe head 28 as described below by detaching the electric connecting apparatus 10 from the support frame 12 (FIG. 1) and placing the electric connecting apparatus 10 in a state in which the electric connecting apparatus 10 is held upside down, that is, in a state in which the probe head 28 faces upward and in which the surface 22a of the wiring substrate 22 faces downward. At this time, the probe head 28 is in a state of being held upside down. Here, "a state of being held upside down" indicates a state in which the lower end portions 34b (refer to FIG. 2) of the probes 34 face in the upper direction illustrated in FIG. 4(a).

For convenience of attachment of the jig 50 to the probe head 28, in the illustrated example, the support body 36 is provided with a plurality of screw holes 59 extending through the lower plate 40 to a part of the spacer 42. On the other hand, the plate 52 is provided with a plurality of (four in the illustrated example) holes 60 corresponding to the plurality of screw holes 59. The four holes 59 are arranged between the other four holes 56. At the time of attaching the jig 50, the jig 50 is mounted so that the surface of the lower plate 40 of the probe head 28 may be covered with the plate 52. Subsequently, the jig 50 is attached to the probe head 28 (refer to FIGS. 4(a) and 4(b)). At this time, the respective holes 56 of the plate 52 are opposed to the respective set screws 26 securing the probe head 28 to the wiring substrate 22, and the magnet 54 is opposed to the lower end portions 34b of the plurality of probes 34. Note that, to facilitate understanding, illustration of the holes 40b provided in the lower plate 40 of the probe head 28 and the lower end portions 34b of the plurality of probes 34 protruded from the holes is omitted.

Figure 5:
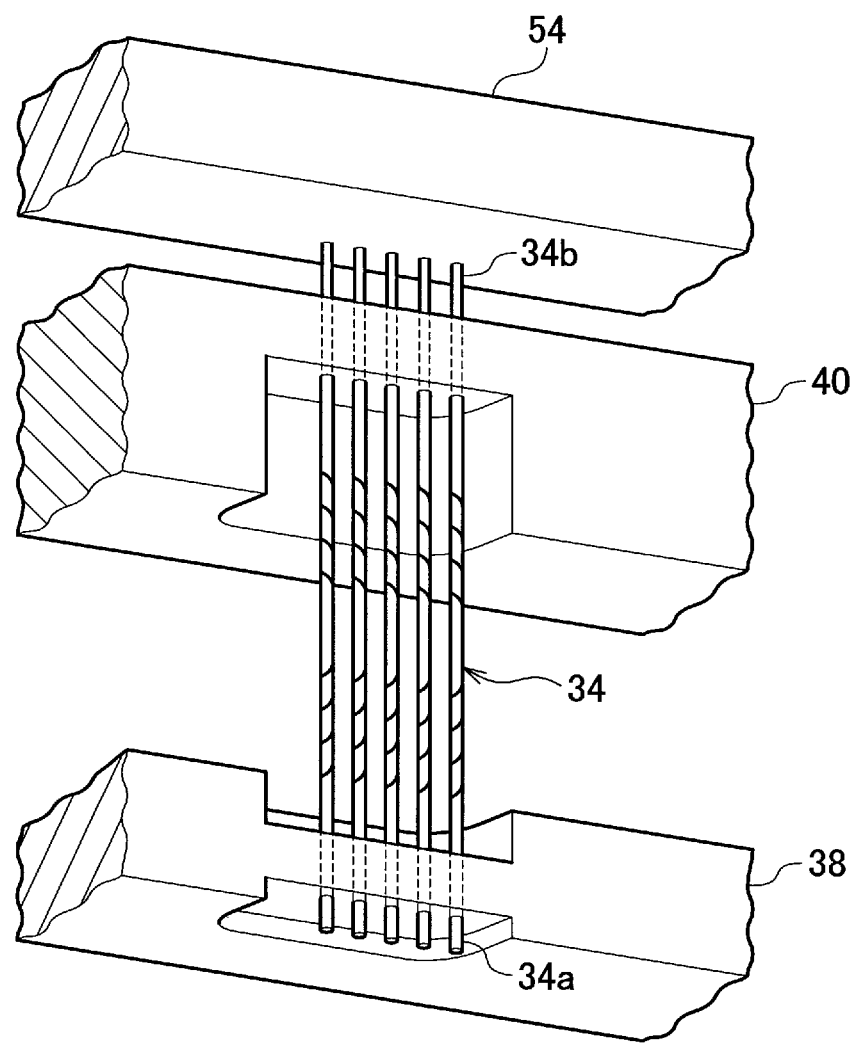
FIG. 5 is a schematic view illustrating a positional relationship between a lower plate and an upper plate of the probe head turned upside down and a plurality of probes, and a magnet of the jig.

The jig 50 can detachably be attached to the probe head 28 by causing a plurality of screws (screws for securement) 62 to pass through the plurality of holes 60 of the plate 52 and screwing the screws 62 into the plurality of screw holes 59 opened in the lower plate 40 of the support body 36 of the probe head 28 (FIGS. 4(a) and 4(b)). As a result of attaching the jig 50, as illustrated in FIG. 5, the respective probes 34 are subject to the magnetic attraction force of the magnet 54 and are attracted toward the magnet 54 of the jig 50. Subsequently, the tip end portion of a screwdriver (not illustrated) is inserted into each of the holes 56 of the plate 52 to loosen and pull out each of the set screws 26. Consequently, securement of the probe head 28 to the wiring substrate 22, more specifically, to the alignment ring 58 attached to the wiring substrate 22, is released (FIG. 4(b)). The probe head 28 securement of which is released can be separated from the wiring substrate 22 together with the jig 50 integrated with the probe head 28 via the screws 62 (FIG. 4(c)). Thereafter, replacement work of the failed probes 34 can be performed by separating the jig 50 from the probe head 28 in a state in which the vertical direction of the probe head 28 is kept, that is, in a state in which the upper end portions 34a and the lower end portions 34b of the probes 34 are located on the upper and lower sides, respectively.

Instead of the illustrated example, the plate 52 of the jig 50 can dispense with the plurality of holes 56. At the time of use of the jig 50 including the plate 52 without the plurality of holes 56, prior to mounting of the jig 50 on the alignment ring 58, the four set screws 26 securing the probe head 28 to the wiring substrate 22 are loosened and removed to release securement of the probe head 28 to the wiring substrate 22. Thereafter, replacement work of the probes 34 can be performed in a similar manner to the above.

Meanwhile, in a case in which the probes 34 subject to the magnetic force of the magnet 54 are in magnetized states, the magnetic attraction force acts among the probes 34, which may make the replacement work of the probes 34 difficult. To avoid this situation, it is preferable to demagnetize all of the probes 34 prior to replacement of the probes 34. The demagnetization can be performed with use of a commercially available demagnetizer (for example, part number HC-33 manufactured by Hozan Tool Ind. Co., Ltd. at Naniwa-ku, Osaka-shi).

The probe head 28 after replacement of the probes 34 can be attached to the wiring substrate 22 again in a reverse procedure of the aforementioned detaching procedure. It is preferable to demagnetize all of the probes 34 after attaching the probe head 28 again due to a similar reason to one mentioned above.

The jig 50 according to the present invention is applicable to a probe head for use in a vertical probe card including probes of other types or other forms instead of the illustrated probes 34.

REFERENCE SIGNS LIST

10—electric connecting apparatus
22—wiring substrate
26—set screw
28—probe head
34, 34a, 34b, 34c—probe, and upper end portion, lower end portion, and intermediate portion thereof
36—support body
38, 38a—upper plate and recess thereof
40, 40a—lower plate and recess thereof
50—jig
52—plate
54—magnet
56—hole

What is claimed is:

1. A jig applied to an electric connecting apparatus, the electric connecting apparatus including a wiring substrate electrically connecting a device under test to a testing apparatus for the device under test, and a probe head secured to a surface of the wiring substrate opposed to the device under test with a plurality of set screws,
the probe head including a plurality of probes each including an upper end portion, a lower end portion, and an intermediate portion between the upper end portion and the lower end portion and made of a magnetic body and a support body supporting the plurality of probes,
the support body including an upper plate and a lower plate which are parallel to each other, the upper plate including a hole allowing the lower end portion, the intermediate portion, and the upper end portion of each of the probes to sequentially pass therethrough, the lower plate including a hole allowing the lower end portion of each of the probes to pass therethrough and preventing the intermediate portion of each of the probes from passing therethrough, the jig comprising:
a plate; and
a magnet attached to the plate,
wherein the plate includes a plurality of holes corresponding to a plurality of screw holes provided in the support body and can detachably be attached to the probe head via a plurality of screws screwed through the plurality of holes into the screw holes, and
wherein the magnet is opposed to the lower end portion of each of the probes.

2. The jig according to claim 1, wherein the plate includes a plurality of holes respectively corresponding to the plurality of set screws.

3. The jig according to claim 1, wherein the magnet is a permanent magnet or an electromagnet.

4. The jig according to claim 1, wherein the probe includes a barrel including a spring portion that can expand and contract in an axial direction thereof and a plunger including a main body arranged in the barrel and secured to the barrel and a tip end portion protruded out of the barrel, and
wherein the barrel constitutes the upper end portion and the intermediate portion of each of the probes, and the tip end portion of the plunger constitutes the lower end portion of each of the probes.

5. The jig according to claim 2, wherein the probe includes a barrel including a spring portion that can expand and contract in an axial direction thereof and a plunger including a main body arranged in the barrel and secured to the barrel and a tip end portion protruded out of the barrel, and
wherein the barrel constitutes the upper end portion and the intermediate portion of each of the probes, and the tip end portion of the plunger constitutes the lower end portion of each of the probes.

6. The jig according to claim 3, wherein the probe includes a barrel including a spring portion that can expand and contract in an axial direction thereof and a plunger including a main body arranged in the barrel and secured to the barrel and a tip end portion protruded out of the barrel, and
wherein the barrel constitutes the upper end portion and the intermediate portion of each of the probes, and the tip end portion of the plunger constitutes the lower end portion of each of the probes.

* * * * *